(12) United States Patent
Siu

(10) Patent No.: US 6,281,579 B1
(45) Date of Patent: *Aug. 28, 2001

(54) INSERT-MOLDED LEADFRAME TO OPTIMIZE INTERFACE BETWEEN POWERTRAIN AND DRIVER BOARD

(75) Inventor: Stephen N. Siu, Los Angeles, CA (US)

(73) Assignee: International Rectifier Corporation, El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/023,125

(22) Filed: Feb. 13, 1998

Related U.S. Application Data

(60) Provisional application No. 60/038,010, filed on Feb. 14, 1997.

(51) Int. Cl.⁷ .......................... H01L 23/12; H01L 25/18; H01L 23/48; H01L 23/52
(52) U.S. Cl. .................. 257/730; 257/673; 257/687; 257/678; 257/731; 257/666; 257/712; 257/704; 257/698; 257/696; 257/692; 257/693; 257/690
(58) Field of Search .......................... 257/666, 678, 257/692, 693, 696, 697, 698, 673, 690, 725, 729, 730, 787, 668, 703, 687, 731–733, 704, 773; 361/704, 728, 823

(56) References Cited

U.S. PATENT DOCUMENTS

| 4,868,638 | * | 9/1989 | Hirata et al. | 257/697 |
| 5,102,829 | * | 4/1992 | Cohn | 29/837 |
| 5,172,215 | * | 12/1992 | Kobayashi et al. | 257/584 |
| 5,517,058 | * | 5/1996 | Temple | 257/692 |
| 5,519,252 | * | 5/1996 | Soyano et al. | 257/698 |
| 5,633,530 | * | 5/1997 | Hsu | 257/698 |
| 5,646,445 | * | 7/1997 | Masumoto et al. | 257/723 |
| 5,686,758 | * | 11/1997 | Arai et al. | 257/693 |
| 5,753,971 | * | 5/1998 | Miller et al. | 257/690 |
| 5,767,579 | * | 6/1998 | Kanazawa et al. | 257/717 |
| 5,825,085 | * | 10/1998 | Masumoto et al. | 257/704 |
| 5,828,126 | * | 10/1998 | Thomas | 257/698 |
| 5,920,119 | * | 7/1999 | Tamba et al. | 257/718 |
| 5,926,373 | * | 7/1999 | Stevens | 257/717 |

OTHER PUBLICATIONS

R. Rutter, B. Pinder, J. Kimball, M. Kalfus, Cost Effective Power Package Handles Up to 3HP Motor Drives, Motion Power, pp. 24–25, 27, 30–32, Jan. 1997.
Motorola Semiconductor Technical Data Sheet, MHPM7A15A60A, 9 pages, (1995).
Motorola Semiconductor Technical Data Sheet, MHPM7A8A120A, Systems Design Guide, pp. 91–93 (1995).

* cited by examiner

Primary Examiner—Alexander O. Williams
(74) Attorney, Agent, or Firm—Ostrolenk, Faber, Gerb & Soffen, LLP

(57) ABSTRACT

An insert-molded leadframe having wire bonding posts formed on an inner portion, device pins formed on an outer portion, and a central portion connecting between the inner portion and the outer portion. Plastic encases the central portion of the conductive leadframe, such that the bonding posts and the device pins are exposed at inner and outer edges, respectively, of the plastic casing. The bonding posts and the device pins are disposed substantially perpendicular to one another. The conductive leadframe is formed with the bonding posts in a first plane and the device pins in a second plane, the first and second planes being substantially mutually parallel. The conductive leadframe then is encased in plastic by injection molding to form the insert-molded leadframe of the invention. An IMS substrate with powertrain electronics is adhered to the bottom of the bonding posts at the inner edge of the insert-molded leadframe, and the powertrain electronics are electrically connected by wire bonding to the top of the bonding posts. A circuit board containing driver electronics is mounted on and electrically connected to the device pins at the outer edge of the plastic casing.

7 Claims, 5 Drawing Sheets

INSERT-MOLDED LEADFRAME TO OPTIMIZE INTERFACE BETWEEN POWERTRAIN AND DRIVER BOARD

This application claims the benefit of U.S. Provisional Application Serial No. 60/038,010, filed Feb. 14, 1997, the disclosure of which is incorporated herein by reference.

BACKGROUND OF THE INVENTION

1. Field of the Invention

The present invention is directed to a high power semiconductor module and, more particularly, to an insert-molded leadframe which optimizes and improves the interface between a power stage and a driver board of the high power module.

2. Description of the Related Art

Conventional power control modules include a power train circuit which comprises two main components—a power stage and a driver board. FIG. 1 schematically illustrates a prior art power stage consisting of power conductors and a component board 2 which operates in conjunction with a module/heat sink assembly 4. The component board 2 includes power components such as diodes, MOSFETs, IGBTS, bipolar transistors, etc. which are connected to form various kinds of circuits such as half bridges, full wave bridges, voltage doublers, and the like.

The power components on component board 2 are controlled by a driver board 6 which contains control circuits such as logic circuitry, microprocessors, and the like to control the power provided from the power elements 2 and 4 to be delivered to a motor or a light ballast, for example.

Another known power control module arrangement is illustrated schematically in FIG. 2, in which driver board 6 interfaces with power components (diodes, MOSFETs, IGBTs) 8 installed on an IMS (insulated metal substrate) board 10. Interconnection between IMS board 10 and driver board 6 is effected through vertical pins 12 that are received in through-holes 14 on the driver board 6. The IMS board 10 is mounted directly to a heat sink 16. The heat sink 16 and IMS board 10 make up the power portion 18 of the module.

IMS substrates such as IMS board 10 are known in the art. Such substrates have semiconductor chips or die thermally secured thereto. The substrate has a relatively thick aluminum body covered by a very thin insulation layer which, in turn, carries a copper pattern that is electrically insulated from the aluminum. Typically, chips are mounted on one or more heat spreaders, to improve thermal management of the heat generated by the chips during operation of the device.

The IMS substrate also includes conductor patterns for receiving bonding wires and effecting connection to the main device terminals. Thus, the die and chips may be internally interconnected to one another on the IMS substrate by stitch-bonding of parallel lead wires. These wires ultimately are connected to pins 12, which extend externally of the casing comprising the power package.

For some time, the industry has been searching intensively for improvements which reduce the cost of circuitry of this type, result in circuits which have a smaller footprint, and deliver improved connectivity between the power circuitry and the driver board.

SUMMARY OF THE INVENTION

The present invention overcomes the deficiencies of the prior art by providing an insert-molded leadframe for a high power semiconductor module package. The insert-molded leadframe includes a conductive leadframe partially encased in a plastic casing. The conductive leadframe has device pins extending vertically on an outer portion thereof, wire bonding posts formed on an inner portion, and a central portion connecting between the inner and outer portions. Plastic encases the central portion of the conductive leadframe, such that the bonding posts and the device pins are exposed at inner and outer edges, respectively, of the plastic casing.

The wire bonding posts are exposed along the inner edge of the leadframe for attachment of an IMS substrate, for example. The device pins extend vertically from the leadframe to receive a circuit board, as described more fully below.

According to a preferred method of manufacturing the insert-molded leadframe, the conductive leadframe first is clamped into a molding tool. The conductive leadframe is clamped such that the bonding posts and the device pins advantageously remain exposed at the inner and outer edges of the plastic casing, respectively. Plastic is injected into the mold around the conductive leadframe.

To facilitate the injection molding process, the conductive leadframe bonding posts preferably are formed in a first plane and the device pins are formed in a second plane, the first and second planes being substantially mutually parallel. Subsequently, the device pins are bent vertically along the outer edge of the plastic casing for attachment to a circuit board. The circuit board preferably has holes that align with and accept the device pins for attachment.

A power package according to the present invention is assembled by inserting the IMS substrate into a central opening of the leadframe, and physically bonding the IMS substrate (populated with components) to the inner edge of the leadframe using liquid adhesive, for example. Adhesive bonds are formed directly between each of the exposed bonding posts and the IMS substrate. Electrical connections between the bonding posts and the substrate are made by wire bonding.

The IMS substrate then is potted, and the leadframe is trimmed prior to testing of the substrate/leadframe assembly. After successful testing, the device board is received over, and soldered to, the device pins.

Power packages manufactured using the insert-molded leadframe of the present invention provide a powertrain circuit which has a smaller footprint and is less expensive than prior art modules. The present invention also provides improved connectivity and support for the driver board. In addition, the present invention provides a device and methodology which improve physical and electrical connectivity to the IMS power board, reducing or eliminating the need for providing electrical take-outs on the IMS power board. The present invention also provides a configuration of a power train circuit that permits obtaining higher operating voltages in smaller packages.

In addition, the invention obviates the need for manual steps in bonding the circuit components to one another. That is, the electrical connection terminals on the device board advantageously can be located to align automatically with the device pins at the outer edge of insert-molded leadframe. Also, because virtually the entire body of the conductive leadframe is embedded in plastic, the individual power pins can be located closer to one another, since the plastic material of the board provides a higher dielectric insulation as compared to the more conventional use of air as a dielectric insulator.

Other features and advantages of the present invention will become apparent from the following description of the invention which refers to the accompanying drawings.

DETAILED DESCRIPTION OF THE INVENTION

Insert-molded Leadframe

Figure 2:
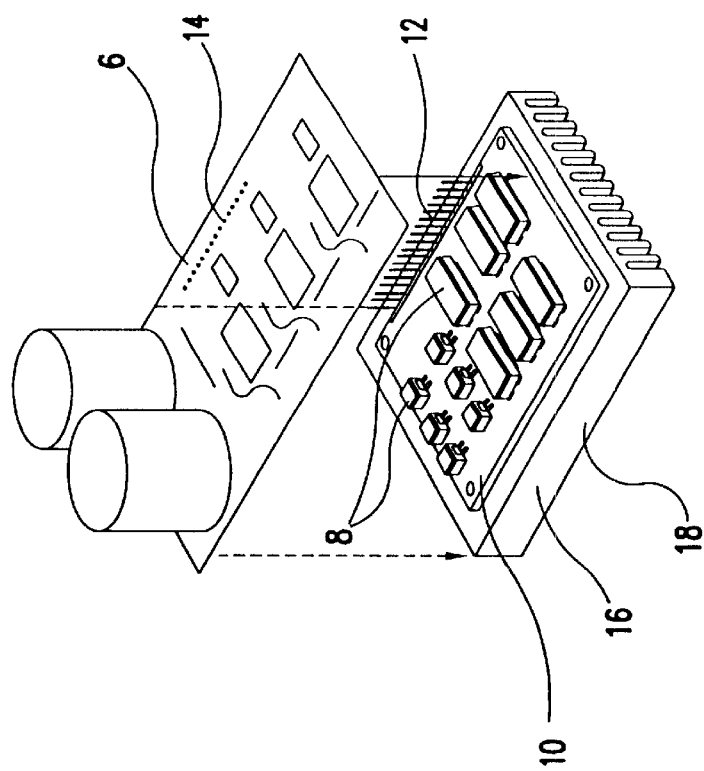
FIGS. 1 and 2 are perspectives of prior art power train circuits.
Figure 1:
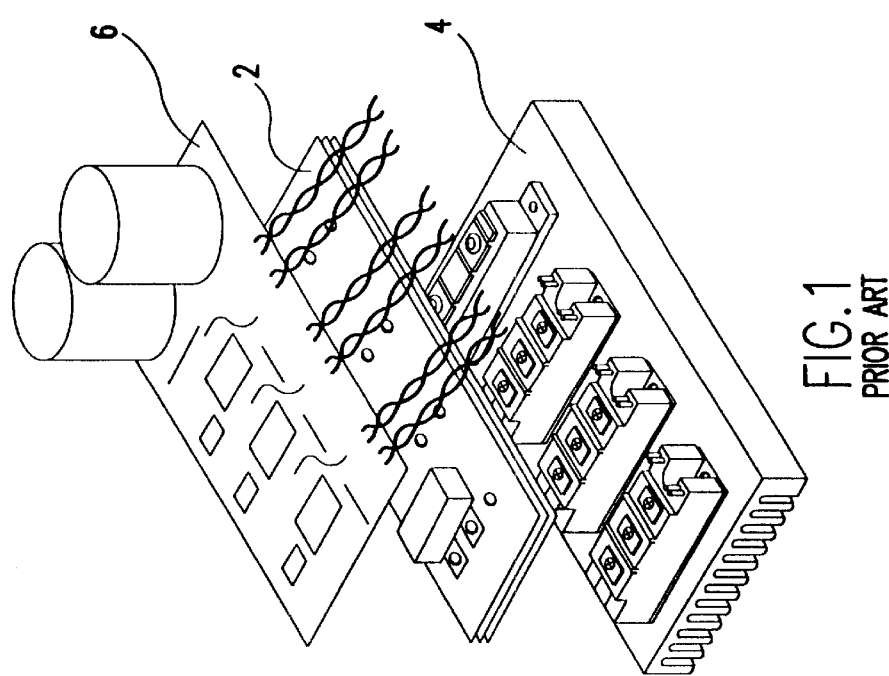
Figure 3:
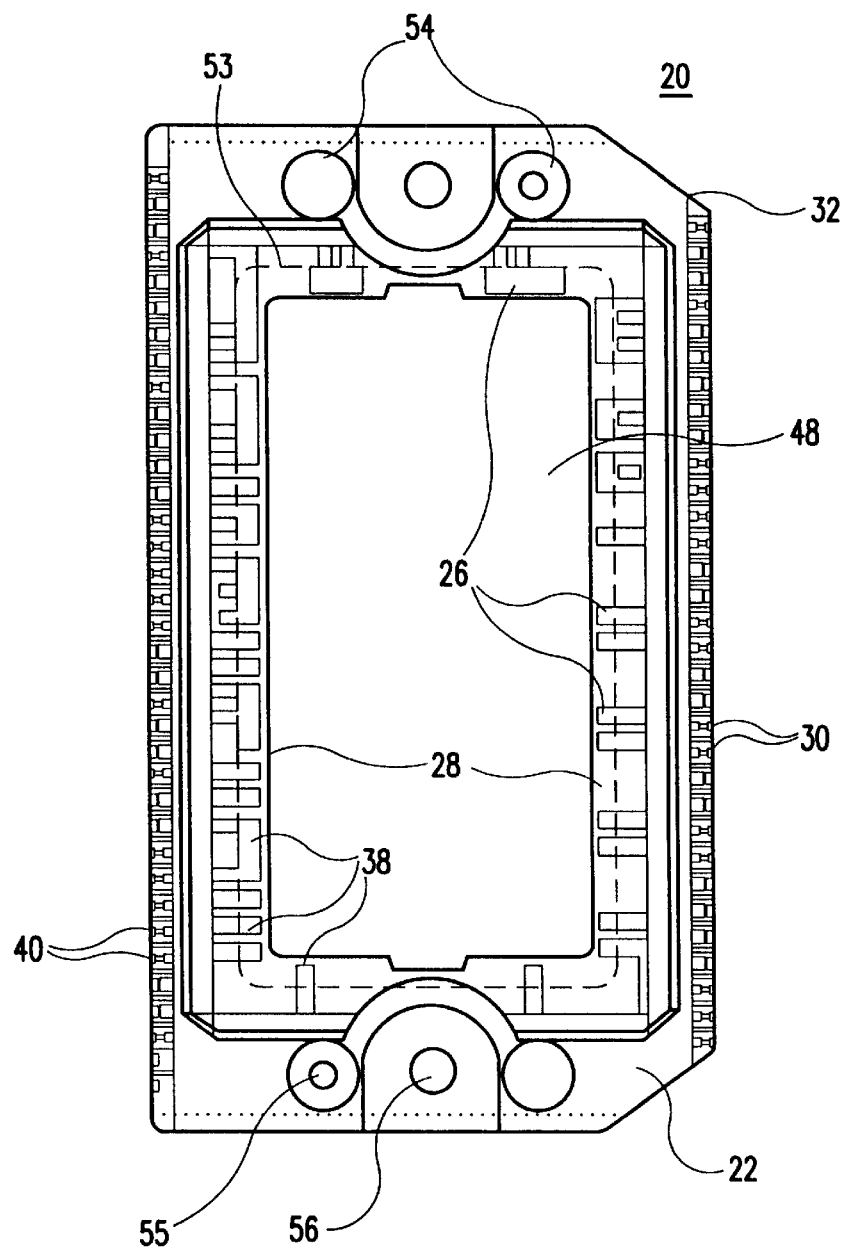
FIG. 3 is a top plan view of the insert-molded leadframe of the present invention.
Figure 4:
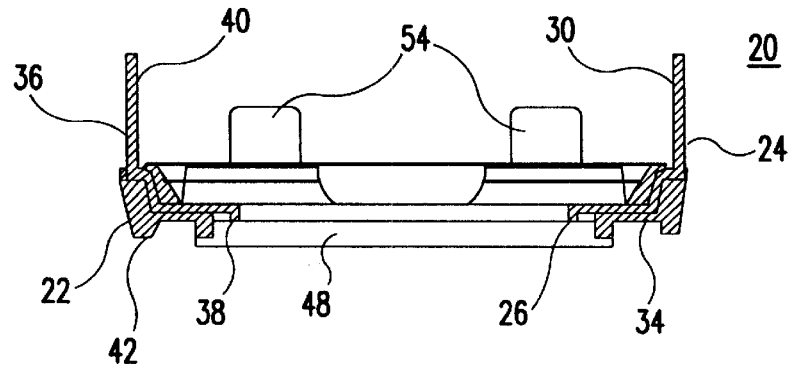
FIG. 4 is a cut-away, end view elevational schematic of an insert-molded leadframe according to the present invention.

Referring to FIGS. 3 and 4, an insert-molded leadframe 20 according to the present invention is shown. The leadframe 20 is formed of a conductive leadframe 24 (FIG. 4) that is insert-molded in a plastic casing 22.

More specifically, conductive leadframe 24 is formed of inner bonding posts 26 and outer device pins 30 connected by a central portion 34. The central portion 34 of leadframe 24 is encased in plastic. Bonding posts 26 and device pins 30 are exposed along an inner edge 28 and an outer edge 32, respectively, of the plastic casing.

1. Leadframes

The present invention preferably includes a pair of opposed conductive leadframes having the above-described structure. The second conductive leadframe 36 is identified in FIGS. 3 and 4 with reference numerals 38, 40, and 42 corresponding to the bonding posts, device pins, and central portion, respectively. As can be seen, plastic casing 22 encases both leadframes 24 and 36.

Figure 5:
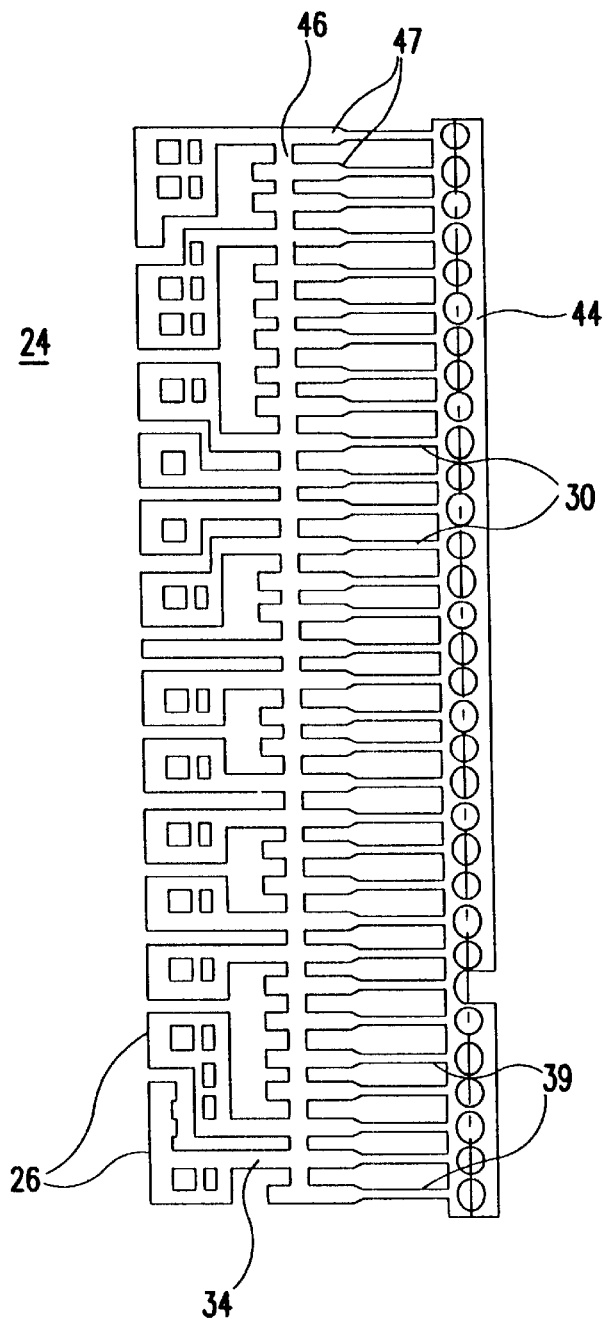
FIG. 5 is a plan view of a conductive leadframe according to the present invention.
Figure 6:
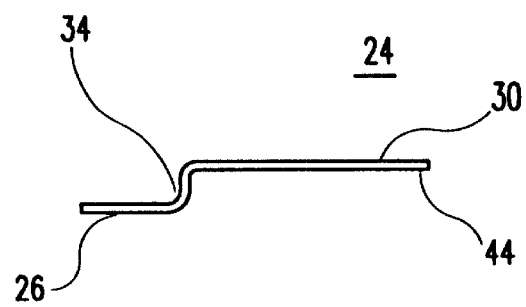
FIG. 6 is an end view elevation of the conductive leadframe of FIG. 5.

Referring to FIGS. 5 and 6, conductive leadframe 24 according to the present invention is shown in greater detail. The stamped conductive leadframe 24 includes a plurality of bonding posts 26 and device pins 30 connected by central portion 34. According to a preferred embodiment, conductive leadframe 24 can be formed from a matrix leadframe. In a first operation, a standard grid pattern is stamped into the conductive leadframe material. The conductive leadframe is formed by a second operation that customizes the standard grid pattern into the desired conductive leadframe configuration.

Conductive leadframe 24 is formed with a trim-away tie bar 44 connecting the device pins 30 for protection from physical and electrostatic influences during handling and manufacture. A dam bar 46 is provided to confine the flow of injected plastic as described more fully below.

Shoulders 47 are formed in device pins 30 to provide support of the device board, as described further below. The shoulder design of the conductive leadframe increases lead width, up to the driver board, to increase conductivity and reduce inductance. The shoulders also provide mechanical support to solder joints and definition of the driver board seating plane.

Referring specifically to FIG. 6, conductive leadframe 24 also is formed with two right-angle turns such that the bonding posts 26 and device pins 30 lie in two, mutually-parallel planes. During manufacture of the insert-molded leadframe, after the two conductive leadframes 24, 36 have been encased in plastic, device pins 30 of the conductive leadframe 24 and device pins 40 of conductive leadframe 36 will be bent vertically. Accordingly, the device pins will form a third right-angle turn such that the device pins are substantially perpendicular to the bonding posts 26 for attachment of a device board, as described more fully below.

Although not shown in FIG. 6, one of ordinary skill readily will appreciate that conductive leadframe 36 has a configuration that is substantially similar to that of conductive leadframe 24, the profile of leadframe 36 being a mirror image of that of conductive leadframe 24 as shown in FIG. 6.

2. Creepage Distance

Figure 7:
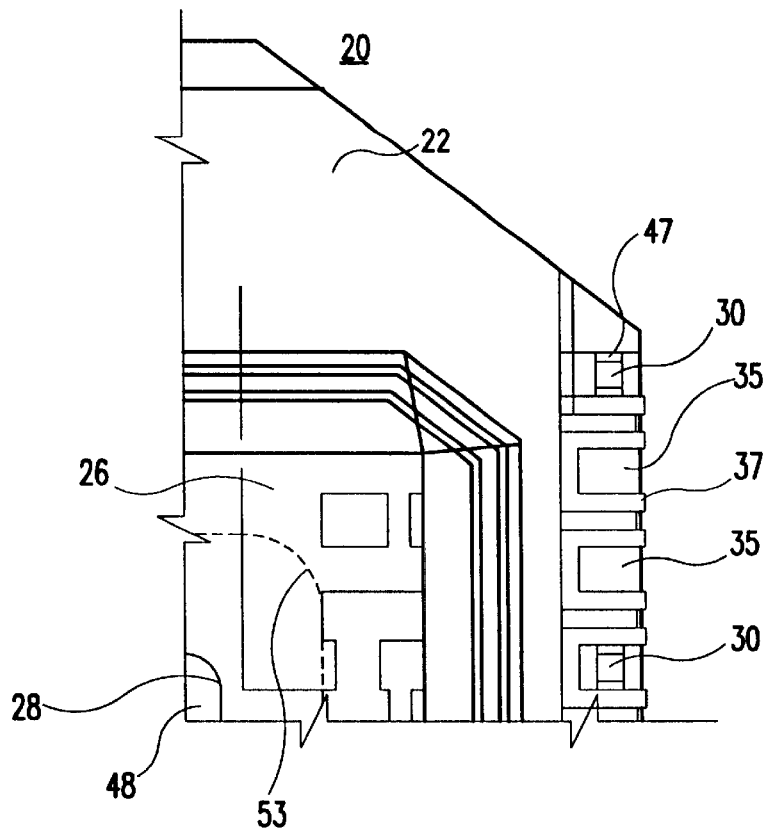
FIG. 7 is a partial view detailing the wire bonding posts and creepage-distance extending features of the insert-molded leadframe of the present invention.
Figure 8:
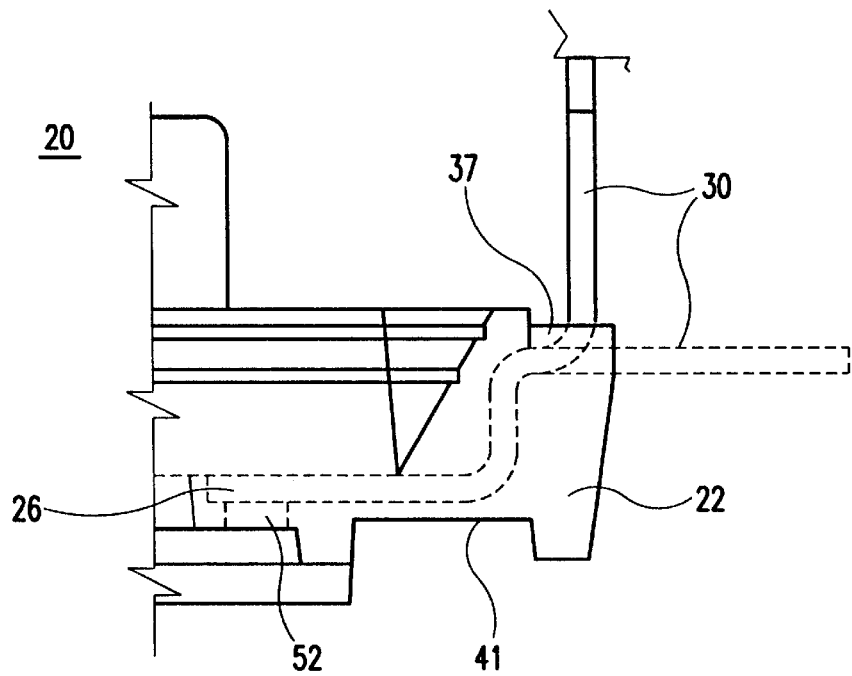
FIG. 8 is a partial view detailing the bonding cavities, device pins and creepage undercuts of the insert-molded leadframe of the present invention.

Referring to FIGS. 7 and 8, the insert-molded leadframe of the present invention includes various features to increase creepage distances along surfaces and between conductors. For example, recesses 35 and protrusions 37 are formed along the outer edge of the plastic casing, between device pins 30. Recesses 35 are formed using "dummy" device pins 39 as part of the manufacturing process set forth more fully below. Further features include undercuts 41 for increasing creepage distance to a heatsink (not shown), for example, mounted to the bottom of the insert-molded leadframe.

Manufacture

The plastic encasement of the insert-molded leadframe is carried out as follows:

Conductive leadframes 24 and 36 initially are clamped into a two-piece mold tool. In order to provide bondable portions and solderable portions on the bonding posts and device pins, respectively, the bonding posts and device pins are clamped to prevent the injected plastic from flowing over the areas of the conductive leadframe that are intended to remain exposed.

The mold is then closed, and plastic is injected into the mold. Dam bar 46 prevents escape of plastic from the mold between the device pins. Once the plastic has set, the insert-molded leadframe is removed from the mold, and the dam bars are removed.

Referring to FIGS. 7 and 8, the upper and lower surfaces of bonding posts 26 are shown free of plastic after removal from the mold. Referring to FIG. 8, the device pins 30 are bent vertically from the molding position (shown in broken outline), to the vertical position (shown in solid outline), taking care to prevent crimping, creasing, or otherwise weakening the device pins.

Dummy pins 39 (FIG. 5) formed in the leadframe 24, 36 have no connection to a bonding post. Consequently, when dam bar 46 and trim-away tie bar 44 are removed, dummy pins 39 fall away, leaving recesses 35 that increase creepage distances, as described above.

Power Package Assembly

Figure 9:
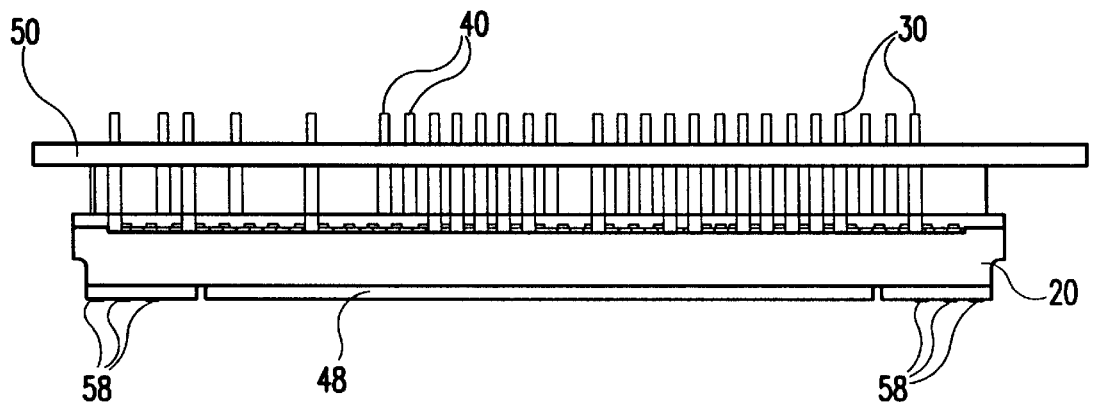
FIG. 9 is a side view elevation schematic of a power package assembly according to the present invention.
Figure 10:
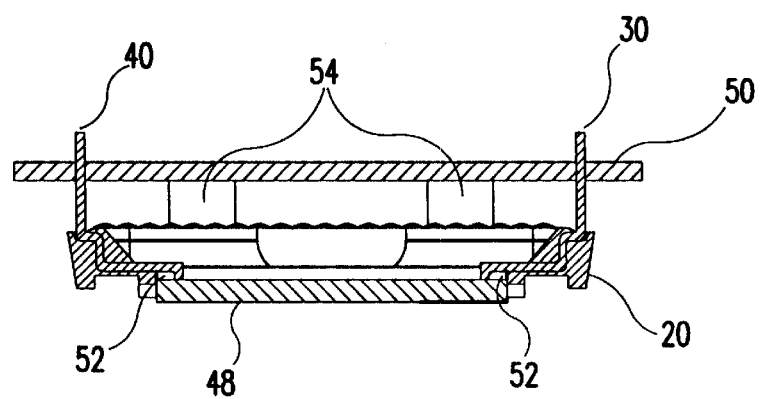
FIG. 10 is an end view elevation schematic of a power package assembly according to the present invention.

Referring next to FIGS. 9 and 10, a power package assembly according to the present invention is shown. The power package includes the insert-molded leadframe 20, an IMS substrate 48, and a driver board 50, shown resting on shoulders 47 (FIG. 5) of device pins 30, 40. As seen in FIG. 10, device pins 30, 40 are received in through-holes formed in device board 50.

Prior to assembly, IMS substrate 48 is populated with surface-mounted components (not shown) that extend vertically into the interior of the leadframe. The IMS substrate fits precisely into a recessed well formed in the bottom of the central opening of insert-molded leadframe 20, closing off the opening. The IMS substrate is bonded into position using liquid adhesive applied at each bonding post, such that a direct physical connection is made between each bonding post and a corresponding position on the substrate.

Advantageously, hollow square cavities 52 are formed in the plastic casing during the molding process under each bonding post. Liquid adhesive is disposed in the hollow square cavities to bond the substrate directly to the bonding posts.

Electrical connections between the substrate and the leadframe are made by wire bonding. Advantageously, the inner edge of the insert-molded leadframe extends beyond an outer edge 53 of the IMS substrate (seen as dashed lines in FIGS. 3 and 7). Accordingly, the bonding posts extend over the IMS substrate, such that direct electrical wire bonds can be formed between the bonding posts and components surface mounted on the IMS substrate. Direct wire bonding allows for shorter wire bonds (lower inductance) and increased use of IMS substrate space due to the reduction in space that otherwise would be required for substrate take-outs.

The plastic casing of insert-molded leadframe 20 also includes stand-offs 54 on which device board 50 rests. Screw holes 55 in standoffs 54 are used to secure the device board to the leadframe for increased module integrity, and to prevent vibration during assembly operations, for example. Mounting holes 56 are provided on either end of the leadframe for attachment to a heat sink, for example.

The heat sink (not shown) can be mounted to the bottom of the IMS substrate, below the leadframe. The bottom surface of the leadframe is formed so as to allow for intimate contact between the IMS substrate and the heat sink.

Collapsible features such as crush dots 58 are formed on the bottom of the insert-molded leadframe. Crush dots 58 collapse as the heat sink mounting screws are torqued to provide a shim between the leadframe and the heat sink to prevent warping of the leadframe. According to a preferred embodiment, crush dots 58 are formed by shaving down ejector pin features formed on the plastic casing during the injection-molding process.

Although the present invention has been described in relation to particular embodiments thereof, many other variations and modifications and other uses will become apparent to those skilled in the art. Therefore, the present invention is to be limited not by the specific disclosure herein, but only by the appended claims.

What is claimed is:

1. An insert-molded leadframe comprising:

a pair of conductive leadframes, each leadframe having wire bonding posts formed on an inner portion, device pins formed on an outer portion, and a central portion forming at least two right-angle turns to connect the inner portion and the outer portion; and a plastic casing supporting the pair of leadframes in a mirror-image arrangement and encasing the central portion of each conductive leadframe, such that the bonding posts and the device pins are exposed at inner and outer edges, respectively, of the plastic casing, each bonding post having a lower surface for receiving a bonding material for adhering a substrate to the lower surface of the bonding post.

2. The insert-molded leadframe of claim 1, wherein the bonding posts and the device pins are disposed substantially perpendicular to one another.

3. The insert-molded leadframe of claim 1, wherein cavities are formed in the plastic casing at each of the bonding posts for receiving the bonding material.

4. A power module package comprising:

an insert-molded leadframe module including:

a conductive leadframe having wire bonding posts and solderable device pins formed on inner and outer portions of the conductive leadframe, respectively, and a central portion connecting the inner and outer portions; and a plastic casing framing a central opening and molded around the conductive leadframe so as to encase the central portion of the conductive leadframe, the bonding posts being exposed at an inner edge of the plastic casing adjacent the central opening, and the device pins being exposed at an outer edge of the plastic casing;

a substrate module received within the central opening of the leadframe module, bonded to the bonding posts and electrically connected to the bonding posts; and a circuit board module mounted on the plastic casing and electrically connected to the device pins, wherein the device pins include shoulders on which the circuit board is supported.

5. A power module package according to claim 4, wherein the device pins protrude through the circuit board.

6. A power module package according to claim 4, wherein the plastic casing includes standoffs.

7. An insert-molded leadframe module for assembling a power module package, the leadframe module comprising:

a conductive leadframe having wire bonding posts formed on an inner portion, device pins formed on an outer portion, and a central portion connecting between the inner portion and the outer portion; and a plastic casing framing a central opening and encasing the central portion of the conductive leadframe, such that the bonding posts and the device pins are exposed at inner and outer edges, respectively, of the plastic casing, each bonding post having a lower surface for receiving a bonding material for adhering a substrate module of the power module package to the lower surface of the bonding post, and each device pin having shoulders for supporting a circuit board module of the power module package.

* * * * *